United States Patent
Keating et al.

(10) Patent No.: US 10,400,366 B2
(45) Date of Patent: Sep. 3, 2019

(54) FABRIC ITEMS HAVING STRANDS VARYING ALONG THEIR LENGTHS

(71) Applicant: Apple Inc., Cupertino, CA (US)

(72) Inventors: Steven J. Keating, Sunnyvale, CA (US); Daniel A. Podhajny, San Jose, CA (US); Daniel D. Sunshine, Sunnyvale, CA (US); Kathryn P. Crews, Menlo Park, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 15/941,325

(22) Filed: Mar. 30, 2018

(65) Prior Publication Data

US 2018/0363172 A1    Dec. 20, 2018

Related U.S. Application Data

(60) Provisional application No. 62/519,398, filed on Jun. 14, 2017.

(51) Int. Cl.
   *D03D 15/00*    (2006.01)
   *D03D 1/00*    (2006.01)
   (Continued)

(52) U.S. Cl.
   CPC ......... *D03D 15/0055* (2013.01); *A45C 3/001* (2013.01); *D01D 5/20* (2013.01);
   (Continued)

(58) Field of Classification Search
   CPC .. D03D 15/0055; D03D 1/0088; D03D 15/00; D03D 15/0033; A45C 3/001;
   (Continued)

(56) References Cited

U.S. PATENT DOCUMENTS

| 4,824,722 A | * | 4/1989 | Jarrett | ............... B32B 17/10018 |
| | | | | 428/430 |
| 5,316,830 A | | 5/1994 | Adams, Jr. et al. | |
| | | (Continued) | | |

FOREIGN PATENT DOCUMENTS

| DE | 59913425-D1 | * | 6/2006 | ........... B65D 88/165 |
| EP | 2941014 A1 | | 4/2015 | |
| | (Continued) | | | |

*Primary Examiner* — Timothy J Thompson
*Assistant Examiner* — Charles Pizzuto
(74) *Attorney, Agent, or Firm* — Treyz Law Group, P.C.; G. Victor Treyz; Kendall W. Abbasi

(57) ABSTRACT

A fabric-based item may include fabric formed from intertwined strands of material. The strands of material may include extruded strands. Strand extrusion equipment may have electrically adjustable sources such as one or more sources of different polymers, dyes, particles, wire, and other elements to be incorporated into an extruded strand. The properties of the strands such as strand stiffness, strand diameter, conductivity, magnetic permeability, opacity, color, thermal conductivity, sand strength, may be varied along their lengths. Fabric formed from the strands may have different areas with different properties. Markers may be formed from particles at particular locations along the lengths of the strands, may be optical marker structures formed from circumferential rings of ink or other visible material on the strands, or may be other markers that can be sensed using electrical sensing, magnetic sensing, optical sensing, or other types of sensing when forming fabric from the strands.

20 Claims, 9 Drawing Sheets

(51) Int. Cl.
| | |
|---|---|
| *D04B 1/16* | (2006.01) |
| *D04B 1/22* | (2006.01) |
| *H05K 5/02* | (2006.01) |
| *A45C 3/00* | (2006.01) |
| *D06M 11/83* | (2006.01) |
| *D01D 5/20* | (2006.01) |
| *D06M 23/16* | (2006.01) |
| *D01D 10/02* | (2006.01) |
| *D01F 1/09* | (2006.01) |
| *D01F 1/10* | (2006.01) |
| *G06F 3/02* | (2006.01) |
| *H03K 17/94* | (2006.01) |
| *H03K 17/96* | (2006.01) |
| *H03K 17/975* | (2006.01) |
| *D04B 35/12* | (2006.01) |
| *A45C 11/00* | (2006.01) |

(52) U.S. Cl.
CPC ............... *D01D 10/02* (2013.01); *D01F 1/09* (2013.01); *D01F 1/10* (2013.01); *D03D 1/0088* (2013.01); *D03D 15/00* (2013.01); *D03D 15/0033* (2013.01); *D04B 1/16* (2013.01); *D04B 1/22* (2013.01); *D04B 35/12* (2013.01); *D06M 11/83* (2013.01); *D06M 23/16* (2013.01); *G06F 3/02* (2013.01); *H03K 17/941* (2013.01); *H03K 17/9625* (2013.01); *H03K 17/975* (2013.01); *H05K 5/0217* (2013.01); *H05K 5/0243* (2013.01); *H05K 5/0247* (2013.01); *A45C 2011/002* (2013.01); *D03D 2700/0133* (2013.01); *D10B 2401/16* (2013.01); *D10B 2401/20* (2013.01); *D10B 2403/02431* (2013.01); *D10B 2505/10* (2013.01); *G06F 2200/1633* (2013.01); *G06F 2203/0384* (2013.01); *H03K 17/962* (2013.01); *H03K 17/9645* (2013.01); *H03K 2217/94108* (2013.01)

(58) Field of Classification Search
CPC .. D01D 5/20; D01D 10/02; D01F 1/09; D01F 1/10; D04B 1/16; D04B 1/22; D04B 35/12; D06M 11/83; D06M 23/16; G06F 3/02; H03K 17/941; H03K 17/9625; H03K 17/975; H05K 5/0217; H05K 5/0247
USPC ........................................................ 174/520
See application file for complete search history.

(56) References Cited

U.S. PATENT DOCUMENTS

| | | | | |
|---|---|---|---|---|
| 5,349,728 | A * | 9/1994 | Murakami | D04H 18/00 28/107 |
| 9,332,792 | B2 | 5/2016 | Harber | |
| 2005/0204449 | A1 | 9/2005 | Baron et al. | |
| 2008/0040906 | A1* | 2/2008 | Earley | D02G 3/42 28/144 |
| 2008/0289078 | A1 | 11/2008 | Mather | |
| 2011/0257761 | A1 | 10/2011 | Mortoarino | |
| 2016/0095377 | A1 | 4/2016 | Tamm | |
| 2017/0252252 | A1* | 9/2017 | Wyatt | A61H 1/008 |
| 2018/0216271 | A1* | 8/2018 | Ashraf | A61F 13/84 |
| 2018/0313010 | A1* | 11/2018 | Ewert | D04H 3/16 |
| 2018/0313750 | A1* | 11/2018 | Greene | A41D 31/00 |
| 2019/0021427 | A1* | 1/2019 | Schultz | B23K 26/352 |

FOREIGN PATENT DOCUMENTS

| | | | |
|---|---|---|---|
| JP | 2000314045 | * | 11/2000 |
| WO | 2017039836 | A1 | 9/2017 |

\* cited by examiner

… … …

FABRIC ITEMS HAVING STRANDS VARYING ALONG THEIR LENGTHS

This application claims the benefit of provisional patent application No. 62/519,398, filed Jun. 14, 2017, which is hereby incorporated by reference herein in its entirety.

FIELD

This relates generally to fabric-based items and, more particularly, to fabric-based items formed from strands of material such as extruded strands.

BACKGROUND

It may be desirable to form bags, furniture, clothing, wearable electronic devices, and other items from materials such as fabric. If care is not taken, however, fabric-based items may not offer desired features. For example, fabric-based items may include fabric that is completely uniform. The use of uniform fabric may make it difficult to satisfy design goals when forming a fabric-based item.

SUMMARY

A fabric-based item may include fabric formed from intertwined strands of material. The strands of material may include extruded strands such as extruded polymer strands. Strand extrusion equipment may have electrically adjustable sources such as one or more sources of different polymers, dyes, particles, wire, and other elements to be incorporated into an extruded strand. Adjustments may be made to the sources and to adjustable components in the extrusion equipment such as heaters, magnets, coating equipment, and other components so as to vary the properties of extruded strands along their lengths. For example, the properties of the strands such as strand stiffness, strand diameter, conductivity, magnetic permeability, opacity, color, may be varied along their lengths.

Fabric formed from the strands may have different areas with different properties. Markers may be formed from particles at particular locations along the lengths of the strands. The markers may be used by equipment for forming fabric to help identify the locations of different portions of the strands and thereby ensure that desired areas in the fabric are provided with desired properties. The markers may be formed from optical marker structures such as circumferential rings of ink or other material on the strands or other marker structures that can be sensed using electrical sensing, magnetic sensing, optical sensing, or other types of sensing when forming fabric from the strands.

Areas of a fabric-based item with different properties may overlap wireless components, optical components, or other components in the item. The fabric in this type of arrangement may form an electrical device housing or other structure that overlaps the components.

DETAILED DESCRIPTION

Figure 1:
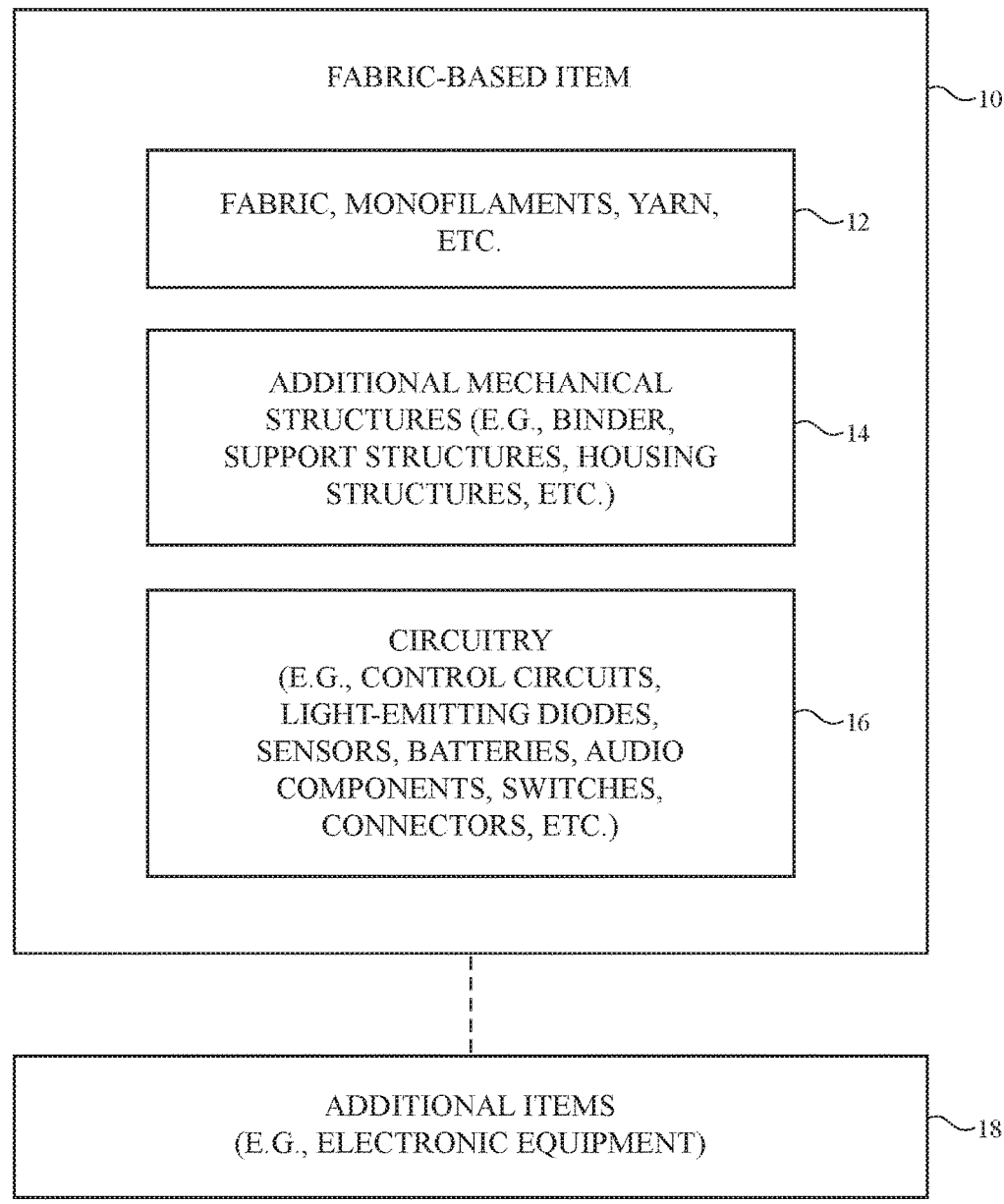
FIG. 1 is a schematic diagram of an illustrative fabric-based item in accordance with an embodiment.

Items such as item 10 of FIG. 1 may be based on fabric. Item 10 may be an electronic device or an accessory for an electronic device such as a laptop computer, a computer monitor containing an embedded computer, a tablet computer, a cellular telephone, a media player, or other handheld or portable electronic device, a smaller device such as a wrist-watch device, a pendant device, a headphone or earpiece device, a device embedded in eyeglasses or other equipment worn on a user's head, or other wearable or miniature device, a television, a computer display that does not contain an embedded computer, a gaming device, a remote control, a navigation device, an embedded system such as a system in which fabric-based item 10 is mounted in a kiosk, in an automobile, airplane, or other vehicle, other electronic equipment, or may be equipment that implements the functionality of two or more of these devices. If desired, item 10 may be a removable external case for electronic equipment, may be a strap, may be a wrist band or head band, may be a removable cover for a device, may be a case or bag that has straps or that has other structures to receive and carry electronic equipment and other items, may be a necklace or arm band, may be a wallet, sleeve, pocket, or other structure into which electronic equipment or other items may be inserted, may be part of a chair, sofa, or other seating (e.g., cushions or other seating structures), may be part of an item of clothing or other wearable item (e.g., a hat, belt, wrist band, headband, sock, glove, shirt, pants, etc.), or may be any other suitable fabric-based item.

Item 10 may include intertwined strands of material that form fabric 12. Fabric 12 may form all or part of a housing wall or other layer in an electronic device, may form internal structures in an electronic device, or may form other fabric-based structures. Item 10 may be soft (e.g., item 10 may have a fabric surface that yields to a light touch), may have a rigid feel (e.g., the surface of item 10 may be formed from a stiff fabric), may be coarse, may be smooth, may have ribs or other patterned textures, and/or may be formed as part of a device that has portions formed from non-fabric structures of plastic, metal, glass, crystalline materials, ceramics, or other materials.

The strands of material in fabric 12 may be single-filament strands (sometimes referred to as fibers or monofilaments), may be yarns or other strands that have been formed by intertwining multiple filaments (multiple monofilaments) of material together, or may be other types of strands (e.g., tubing that carries fluids such as gases or liquids). The strands may include extruded strands such as extruded monofilaments and yarn formed from multiple extruded monofilaments. Monofilaments for fabric 12 may include polymer monofilaments and/or other insulating monofilaments and/or may include bare wires and/or insulated wires. Monofilaments formed from polymer cores with metal coatings and monofilaments formed from three or more layers (cores, intermediate layers, and one or more outer layers each of which may be insulating and/or conductive) may also be used.

Yarns in fabric 12 may be formed from polymer, metal, glass, graphite, ceramic, natural materials as cotton or bamboo, or other organic and/or inorganic materials and combinations of these materials. Conductive coatings such as metal coatings may be formed on non-conductive material. For example, plastic yarns and monofilaments in fabric 12 may be coated with metal to make them conductive. Reflective coatings such as metal coatings may be applied to make yarns and monofilaments reflective. Yarns may be formed from a bundle of bare metal wires or metal wire intertwined with insulating monofilaments (as examples).

Strands of material may be intertwined to form fabric 12 using intertwining equipment such as weaving equipment, knitting equipment, or braiding equipment. Intertwined strands may, for example, form woven fabric, knit fabric, braided fabric, etc. Conductive strands and insulating strands may be woven, knit, braided, or otherwise intertwined to form contact pads that can be electrically coupled to conductive structures in item 10 such as the contact pads of an electrical component. The contacts of an electrical component may also be directly coupled to an exposed metal segment along the length of a conductive yarn or monofilament.

Conductive and insulating strands may also be woven, knit, or otherwise intertwined to form conductive paths. The conductive paths may be used in forming signal paths (e.g., signal buses, power lines, etc.), may be used in forming part of a capacitive touch sensor electrode, a resistive touch sensor electrode, or other input-output device, or may be used in forming other patterned conductive structures. Conductive structures in fabric 12 may be used in carrying power signals, digital signals, analog signals, sensor signals, control signals, data, input signals, output signals, or other suitable electrical signals.

Item 10 may include additional mechanical structures 14 such as polymer binder to hold strands in fabric 12 together, support structures such as frame members, housing structures (e.g., an electronic device housing), and other mechanical structures.

Circuitry 16 may be included in item 10. Circuitry 16 may include electrical components that are coupled to fabric 12, electrical components that are housed within an enclosure formed by fabric 12, electrical components that are attached to fabric 12 using welds, solder joints, adhesive bonds (e.g., conductive adhesive bonds such as anisotropic conductive adhesive bonds or other conductive adhesive bonds), crimped connections, or other electrical and/or mechanical bonds. Circuitry 16 may include metal structures for carrying current, electrical components such as integrated circuits, light-emitting diodes, sensors, controller circuitry for applying currents and/or magnetic fields to materials, electrically controlled devices for illuminating tubing and/or applying control signals to tubing or other strands, and other electrical devices. Control circuitry in circuitry 16 may be used to control the operation of item 10 by controlling electrically controllable (electrically adjustable) components in circuitry 16 and may be used to support communications with item 18 and/or other devices.

Item 10 may interact with electronic equipment or other additional items 18. Items 18 may be attached to item 10 or item 10 and item 18 may be separate items that are configured to operate with each other (e.g., when one item is a case and the other is a device that fits within the case, etc.). Circuitry 16 may include antennas and other structures for supporting wireless communications with item 18. Item 18 may also interact with item 10 using a wired communications link or other connection that allows information to be exchanged.

In some situations, item 18 may be an electronic device such as a cellular telephone, computer, or other portable electronic device and item 10 may form a cover, case, bag, or other structure that receives the electronic device in a pocket, an interior cavity, or other portion of item 10. In other situations, item 18 may be a wrist-watch device or other electronic device and item 10 may be a strap or other fabric-based item that is attached to item 18 (e.g., item 10 and item 18 may together form a fabric-based item such as a wristwatch with a strap). In still other situations, item 10 may be an electronic device (e.g., a wearable device such as a wrist device, clothing, etc.), fabric 12 may be used in forming the electronic device, and additional items 18 may include accessories or other devices that interact with item 10. Signal paths formed from conductive yarns and monofilaments (e.g., insulated and bare wires) may be used to route signals in item 10 and/or item(s) 18.

The fabric that makes up item 10 may be formed from strands that are intertwined using any suitable intertwining equipment. With one suitable arrangement, which may sometimes be described herein as an example, fabric 12 may be woven fabric formed using a weaving machine. In this type of illustrative configuration, fabric may have a plain weave, a basket weave, a satin weave, a twill weave, or variations of these weaves, may be a three-dimensional woven fabric, or may be other suitable fabric. With other suitable arrangements, fabric 12 is knit or braided.

Figure 2:
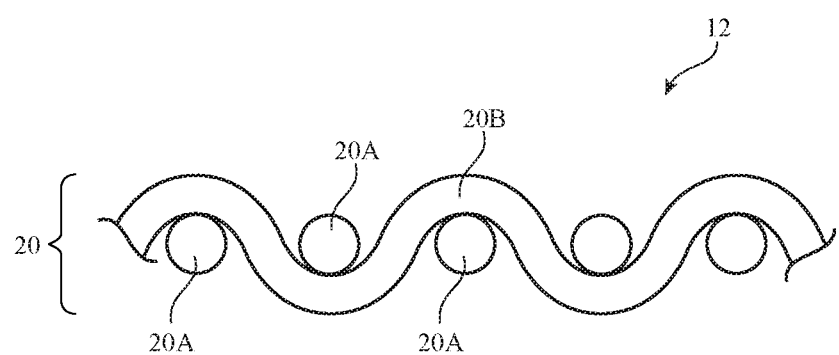
FIG. 2 is a side view of illustrative woven fabric in accordance with an embodiment.

A cross-sectional side view of illustrative woven fabric 12 is shown in FIG. 2. As shown in FIG. 2, fabric 12 may include strands 20 such as warp strands 20A and weft strands 20B. In the illustrative configuration of FIG. 2, fabric 12 has a single layer of woven strands 20. Multi-layer fabric constructions may be used for fabric 12 if desired.

Figure 3:
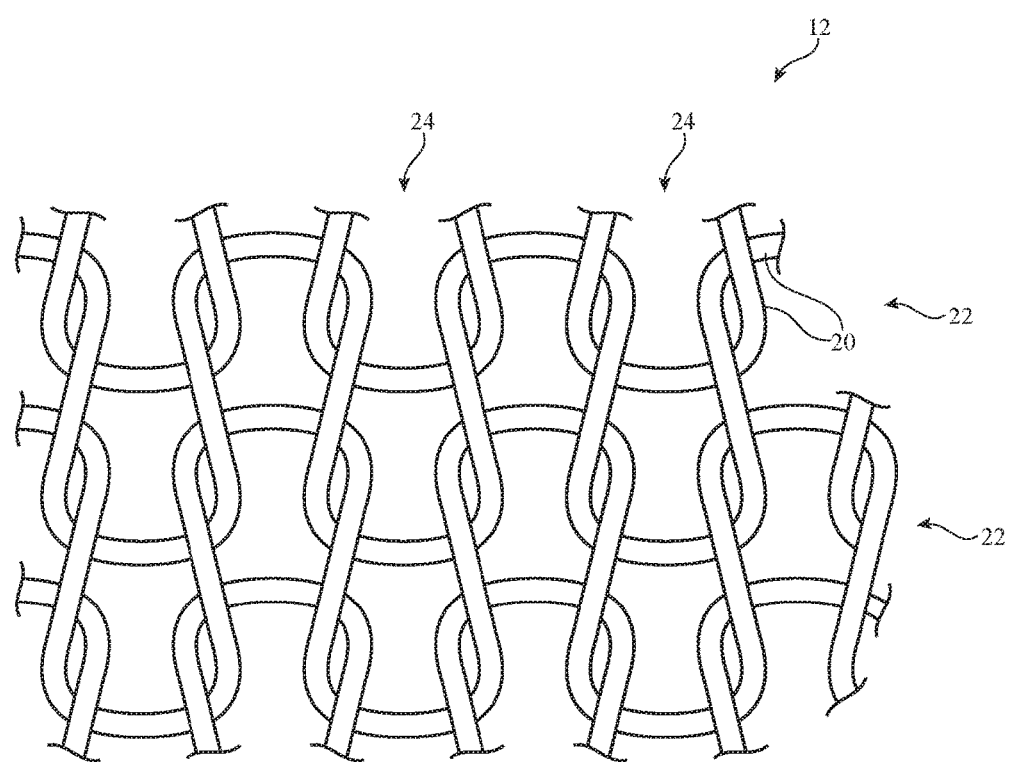
FIG. 3 is a top view of illustrative knit fabric in accordance with an embodiment.

As shown in FIG. 3, fabric 12 may be a knit fabric. In the illustrative configuration of FIG. 3, fabric 12 has a single layer of knit strands 20 that form horizontally extending rows of interlocking loops (courses 22) and vertically extending wales 24. Other types of knit fabric may be used in item 10, if desired.

Fabric-based item 10 may include non-fabric materials (e.g., structures such as structures 14 that are formed from plastic, metal, glass, ceramic, crystalline materials such as sapphire, etc.). These materials may be formed using molding operations, extrusion, machining, laser processing, and other fabrication techniques. In some configurations, some or all of fabric-based item 10 may include one or more layers of material. The layers in item 10 may include layers of polymer, metal, glass, fabric, adhesive, crystalline materials, ceramic, substrates on which components have been mounted, patterned layers of material, layers of material containing patterned metal traces, thin-film devices such as transistors, and/or other layers.

Figure 4:
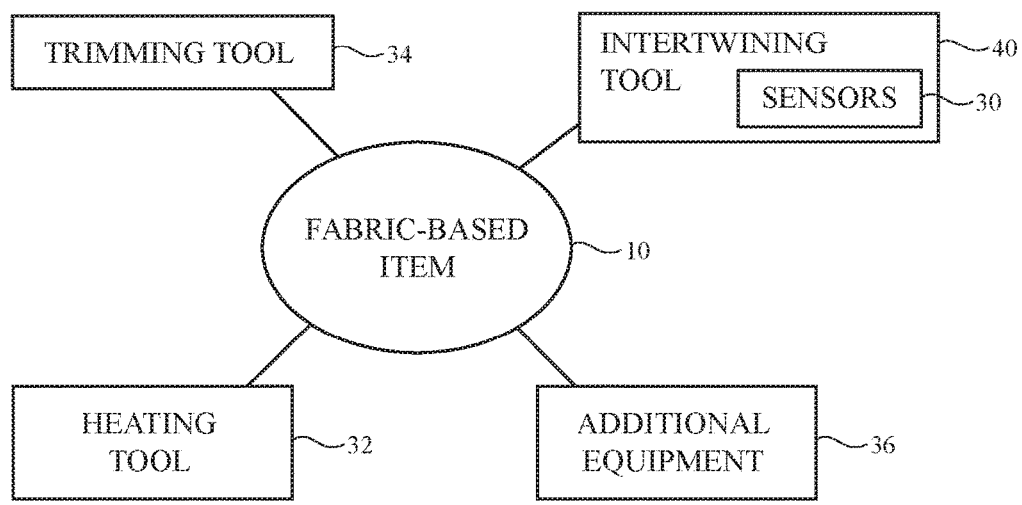
FIG. 4 is a diagram of illustrative equipment for forming a fabric-based item in accordance with an embodiment.

FIG. 4 is a diagram of illustrative equipment that may be used in forming fabric-based item 10. Intertwining equipment such as tool 30 may include equipment such as braiding equipment, knitting equipment, and weaving equipment. Tool 30 may be used in forming fabric 12, strands in fabric 12, or other suitable intertwined strands. The strands formed by tool 30 may include strands with properties that vary along their lengths. For example, strands 20 may include strands having diameters that vary along the lengths of the strands or may include strands having material compositions or other properties that vary along the lengths of the strands. If desired, tool 30 may include sensors such as sensors 40. Sensors 40 may monitor strands 20 during intertwining (e.g., when dispensing strands 20 into a weaving machine, into a knitting machining, into a braiding machine, etc.). For example, sensors 40 may monitor the optical properties of strands 20, may monitor the diameter of strands 20, may monitor for the presence of magnetic or conductive particles in strands 20, and/or may otherwise monitor strands 20 along their lengths as strands 20 are being incorporated into fabric 12. If desired, markers may be added to the strands during strand formation to assist sensors 40 in monitoring strands 20 during fabric formation. In this way, feedback adjustments may be made to tool 30 to ensure that desired portions of strands 20 are incorporated into desired locations in fabric 12.

Cutting equipment such as trimming tool 34 (e.g., a mechanical cutting tool, a laser cutting tool, or other equipment for cutting yarn) may be used in cutting fabric 12. For example, tool 34 may be used in cutting away undesired portions of fabric 12 and/or portions of strands in fabric 12.

Heating tool 32 may be used in applying heat to tubing and other strands of material in fabric 12. Heating tool 32 may include a laser for supplying heat, a reflow oven, an inductive heating tool for heating solder, a heat gun, a lamp, hot bar equipment, a soldering iron tip, equipment for forming heat by applying current (ohmic heating current) to a conductive strand, or may include other heating equipment.

Additional equipment such as equipment 36 may be used to help form fabric 12, strands for fabric 12, circuitry that is coupled to conductive structures in fabric 12, electrical components, housing structures, and other structures for forming item 10. Equipment 36 may, for example, include equipment for cutting fabric, equipment for laminating fabric to layers of plastic, metal, and/or other materials, equipment for mounting integrated circuits, light-emitting diodes, sensors, buttons, and other electrical circuitry to fabric 12 and/or other portions of item 10, machining equipment for machining parts of item 10, robotic assembly equipment, and/or other equipment for forming item 10. The equipment of FIG. 4 may be used to form fabric 12, to process fabric 12, to integrate circuitry 16, fabric 12, and/or additional structures 14 into item 10, and/or to perform other fabrication and processing operations on item 10.

Strands 20 may include strands of material that are uniform along their lengths and may include strands of material that are nonuniform along their lengths. Strands that vary along their lengths may be used to form fabric that has different properties in different areas. For example, optical properties such as optical transparency (opacity), reflectivity, and color may be varied along the lengths of a set of strands and, when these strands are incorporated into fabric 12, fabric 12 may exhibit corresponding regions with different transparency values, different reflectivity values, and/or different colors. Mechanical properties may also be varied in strands 20 along their lengths. As an example, tensile strength, flexibility, surface roughness, porosity, hydrophobicity, strand diameter, stiffness, thermal conductivity, and/or other properties may be different at different portions along the length of a strand. Magnetic properties (e.g., the magnetic permeability and/or magnetization of strands 20), electrical properties (e.g., conductivity and radio-transparency, etc.), and/or other physical properties may also be varied along the length of each strand.

Figure 5:
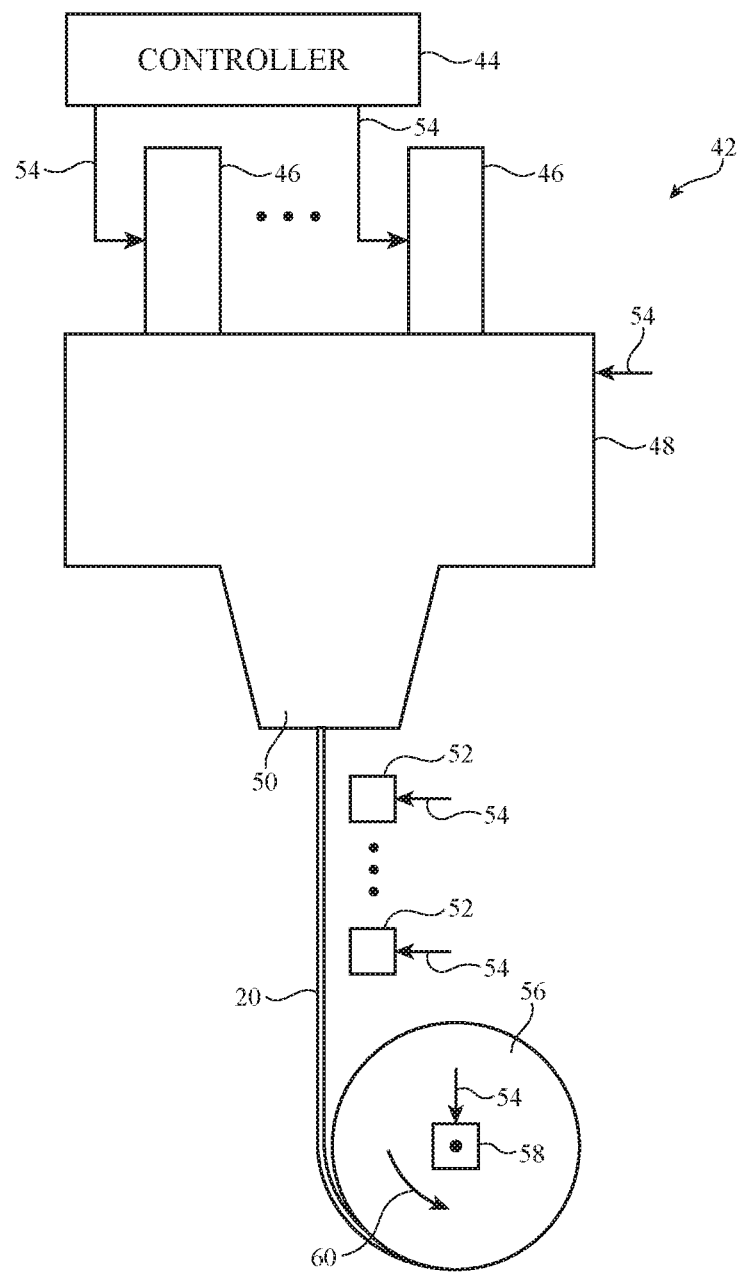
FIG. 5 is a diagram of illustrative strand extruding equipment in accordance with an embodiment.

Illustrative strand fabrication equipment of the type that may be used in forming strands 20 with characteristics that vary as a function of length along the strands is shown in FIG. 5. Strand fabrication equipment 42, which may sometimes be referred to as strand extruding equipment, may have a controller such as controller 44. Controller 44 may issue commands to electrically controllable components using control signal paths such as paths 54 to vary the properties of strand 20 as strand 20 is extruded from extrusion nozzle 50 in extruder 48 and collected on wheel 56. Wheel 56 may be rotated in direction 60 using motor 58. The rate at which wheel 56 is rotated may be varied dynamically in response to control commands from controller 44 on path 54 (e.g., to thin strand 20 by pulling more rapidly on strand 20 or to thicken strand 20 by pulling less rapidly on strand 20). If desired, extruder 48 and nozzle 50 may be heated (e.g., to a temperature that is adjusted by controller 44). Material sources 46 may dispense adjustable amounts of material into extruder 48 (e.g., molten polymer and other liquids, gasses, powders made up of particles, wires, and/or other materials). There may be one or more sources 46 in equipment 42, two or more sources 46 in equipment 42, three or more sources 46 in equipment 42, or other suitable numbers of sources 46 in equipment 42. Each source may dispense a different respective material into extruder 48 as a function of time under the control of controller 44. This allows controller 44 to dynamically vary the respective concentrations of each of the materials that make up strand 20.

As an example, one of sources 46 may include a polymer (e.g., pellets of polymer that are melted in extruder 48) and another one of sources 46 may include a metal powder. The amount of metal powder that is incorporated into strand 20 as a function of length (and therefore properties such as the conductivity of strand 20 along its length) may be varied by adjusting the rate at which the metal powder is dispensed into extruder 48 relative to the rate at which the polymer is provided to extruder 48. As another example, a first of sources 46 may include a first polymer, a second of sources 46 may include a second polymer, and a third of sources 46 may include a source of particles. The concentration of the particles and the relative concentrations of the first and second polymers can be dynamically adjusted by adjusting the sources. For example, in some portions of strand 20, there may be more of the first polymer than the second polymer, so the properties of the first polymer will predominate and in other portions of strand 20 there may be more of the second polymer than the first polymer, so the properties of the second polymer will predominate. In one or both of these portions of strand 20, the concentration of particles may be varied (e.g., to adjust physical properties, optical properties, electrical properties, magnetic properties, etc.).

As shown in FIG. 5, equipment 42 may include components 52 that modify strand 20 in response to control signals from controller 44. Components 52 may include heating components that supply adjustable amounts of heat to strand 20, light-emitting components that supply adjustable amounts of light to strand 20, magnetic components (e.g., one or more electromagnets) that supply adjustable amounts of magnetic field to components 20, mechanical tools (e.g., equipment for selectively roughening the surface of strand 20 using airborne particles, using a grinding wheel, embossing wheels, etc.), coating equipment (e.g., equipment for selectively spraying coatings onto strand 20), and/or other components for varying the properties of strand 20 as strand 20 is drawn out of nozzle 50 and onto wheel 56.

Using equipment 42, one or more characteristics of strand 20 may be varied along the length of strand 20. As an example, the thickness (diameter) of strand 20 can be varied, the thermal conductivity of strand 20 can be varied, the surface roughness of strand 20 can be varied, the opacity, transparency, reflectivity, and color of strand 20 can be varied, the concentration of sensing agents (e.g., biological agents or chemical reagents that are configured to react with substances being sensed) can be varied, the stiffness (rigidity), the strength (e.g., compressive strength, tensile strength, wear resistance, etc.) of strand 20 can be varied, magnetic particle concentration can be varied to adjust magnetic permeability (e.g., the concentration with which particles such as iron particles or other magnetic particles are incorporated), the magnetization of strand 20 can be varied (e.g., whether magnetic material in strand 20 has random magnetic domains or has been magnetized by application of a magnetic field from an electromagnet in components 52), conductive particle concentration can be varied to alter the conductivity (e.g., the concentration of metal particles such as copper particles, and/or other conductive particles that are incorporated can be varied), the thickness and patterns of coatings can be varied (e.g., to create patterns of circumferential coating bands at particular locations along the lengths of strands 20), and/or other properties can be varied. If desired, particles such as nanoparticles (e.g., carbon nanotubes, quantum dots, etc.) may be incorporated into strands 20 and/or silicon integrated circuits or other integrated circuits may be incorporated into strands 20.

In some configurations, controller 44 adjusts the relative feed rates for sources 46, so that the composition of strand 20 is dynamically varied. In other configurations, the operation of strand-modifying devices such as components 52 can be dynamically varied. In general, adjustments to sources 46, adjustments to components 52, adjustments to nozzle 48, and/or adjustments to strand pull rate (rotation rate for wheel 56) can be made. For example, the color of strand 20 can be varied by adjusting the concentration of dye that is incorporated into strand 20 from one of sources 46 and can be adjusted by varying the color of a coating that is applied to strand 20 by one of components 52. As another example, strand stiffness may be varied by adjusting the relative concentrations of flexible and rigid polymers using sources 46 and strand conductivity can be varied by adjusting the amount of conductive coating applied to strand 20 by one of components 52.

Figure 6:
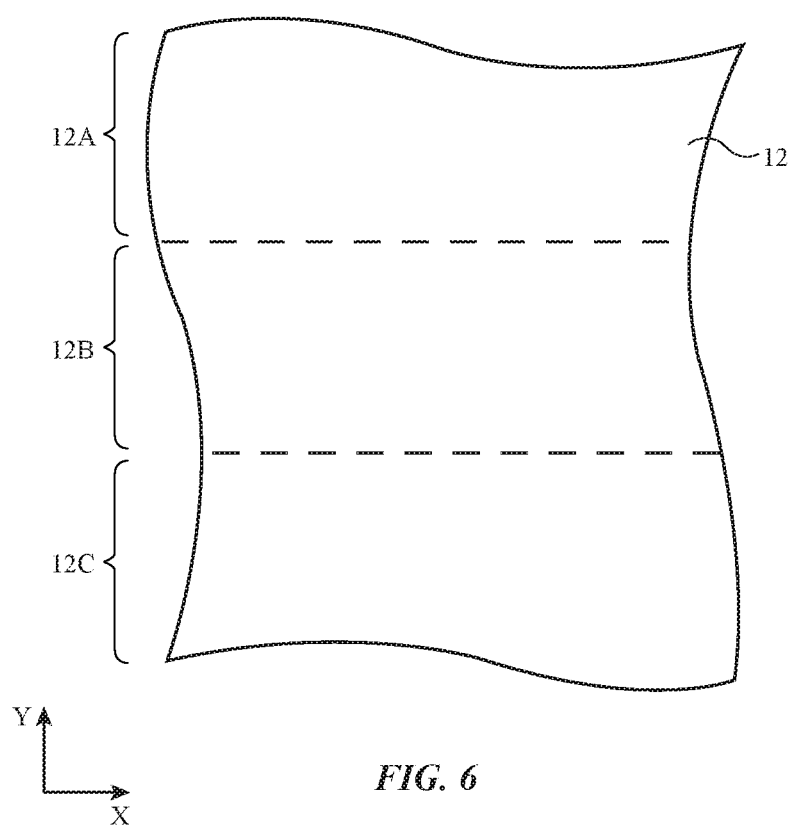
FIG. 6 is a diagram of illustrative fabric with regions having different properties in accordance with an embodiment.

Strands 20 with properties that vary along their lengths may be intertwined to form fabric 12 using equipment 30. As strands 20 are incorporated into fabric 12, sensors 40 in equipment 30 may be used to monitor location-specific registration elements on strands 20 (e.g., marks, magnetic tags, conductive dots, and/or other markers that are incorporated into strands 20 to delineate the portions of strands 20 that have particular properties). This may enhance placement accuracy and thereby ensure that portions of strands 20 with desired properties are located precisely in desired locations in fabric 12. In this way, fabric 12 may be formed that has different portions with different properties. As shown in FIG. 6, for example, fabric 12 may have a first portion such as portion 12A that is formed from portions (segments) of strands 20 that have a first property, may have a second portion such as portion 12B that is formed from segments of strands 20 that have a second property, and may have a third portion such as portion 12C that is formed from segments of strands 20 that have a third property. Areas such as areas 12A, 12B, and 12C may be discrete regions of fabric 12 and/or the properties of fabric 12 may be varied continuously as a function of location within fabric 12 (e.g., across dimensions X and/or Y in the example of FIG. 6).

Figure 7:
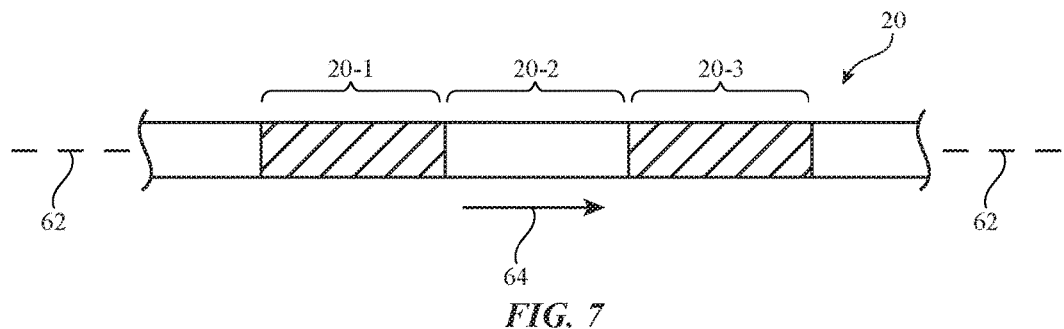
FIG. 7 is a diagram of an illustrative strand with a property that varies along its length in accordance with an embodiment.

FIG. 7 is a diagram of an illustrative strand 20 with a characteristic that varies along its length. As shown in FIG. 7, strand 20 may extend along strand axis (longitudinal axis) 62. One or more properties of strand 20 may vary in dimension 64 along the length of strand 20 (e.g., along axis 62). For example, strand 20 may have a first property in a region such as portion (segment) 20-1, a second property in portion 20-2, and may have a third property in portion 20-3. Portions 20-1 and 20-3 may be, for example, circumferential bands of coating material (e.g., dye or metal) and portion 20-2 may be an uncovered portion of strand 20. In another illustrative configuration, portions 20-1 and 20-3 may contain embedded particles (e.g., at different concentrations or at the same concentration) and portion 20-2 may be free of particles. Markers may be formed by arranging the portions of strands 20 that have different properties.

Figure 8:
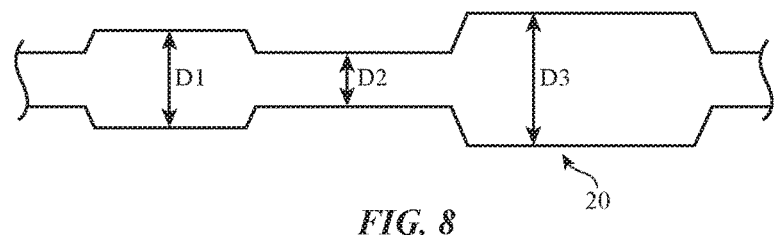
FIG. 8 is a diagram of an illustrative strand with a diameter that varies along its length in accordance with an embodiment.
Figure 9:
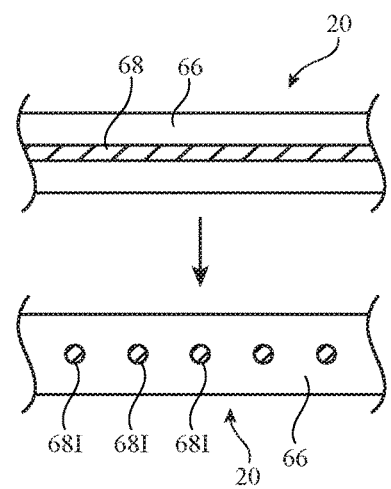
FIG. 9 is a diagram of an illustrative strand with a core that is being selectively altered at a location along its length in accordance with an embodiment.

In general, strand properties may vary in steps (as shown in FIG. 7) and/or may have continuously varying properties. For example, the stiffness of strand 20 may vary sinusoidally as a function of distance along dimension 64 (as one example). FIG. 8 shows how the diameter of strand 20 may vary (e.g., the diameter of strand 20 of FIG. 8 may be D1 in a first portion of strand 20, may be D2 in a second portion of strand 20, and may be D3 in a third portion of strand 20. Configurations in which strand diameter is varied continuously may also be used. Strand diameter may be adjusted, for example, by varying the rate at which wheel 56 pulls (draws) strand 20 from nozzle 50. Any suitable strand property or properties can be varied in this way. FIG. 9 shows how strand 20 can be modified using a heating device (e.g., a heater in components 52 of FIG. 5). Initially, strand 20 may include a core such as metal core 68 surrounded by coating 66 (e.g., a polymer coating), as shown in the upper portion of FIG. 9. Core 68 may, as an example, be formed form a low-melting-point solder. As shown in the lower portion of FIG. 10, when heat is selectively applied to a portion of solder core 68 (e.g., by inductive heating, by applying light or hot air, etc.), that portion of core 68 may melt and coalesce into spherical droplets that, when cooled, form individual metal spheres in the core of strand 20. Electromagnets may be used to selectively magnetize portions of strand 20, coating equipment (e.g., equipment for spraying on coatings or otherwise applying coatings to strand) may be used to selectively coat portions of strand 20, and/or other adjustments may be made to strand 20 during the process of forming strand 20 with the equipment of FIG. 5.

By modulating the properties of strand 20 as strand 20 is formed, information may be encoded into strands 20. As an example, markers can be incorporated into strands 20 that identify locations in strands 20 where the properties of strands 20 change (e.g., where strands 20 transition between a rigid material and a flexible material, where strands 20 changes color, where strands 20 transition between having a first type of embedded particle or first particle concentration and a second type of embedded particle and/or second particle concentration, where strand 20 change diameter, etc. The inclusion of markers may enhance placement accuracy by helping equipment 30 incorporate segments of strands 20 that have desired properties into desired areas of fabric 12. Markers may be implemented using multi-element codes. For example, markers may be formed that have a particular number of bands of conductive material (e.g., three bands in a row or three bands separated with unequal spacing, etc.) or may be formed from a sequence of regions with embedded magnetic particles or conductive particles, etc. Markers may, if desired, signify the beginning of a portion of a strand with a particular property. Markers can be formed using one or more dyes or other materials detectable optical properties (e.g., one or more colors such as colors that are distinguishable from the native color of strand 20), magnetic particles and/or conductive particles of different sizes, permeability values, conductivities, and/or other measurable properties, mechanical marks (e.g., roughened bands), coating patterns (e.g., circumferential bands of metals, inks, etc. that can be optically detected or detected using magnetic sensors, electrical sensors, etc.), and/or other distinguishing local variations in the properties of strands 20 that serve as registration information. If desired, markers may be used to encode strands with other information (e.g., a batch number information, a strand identifier, or other information related to the source of a strand, the properties of a strand, the date of manufacture of a strand, etc.).

Figure 10:
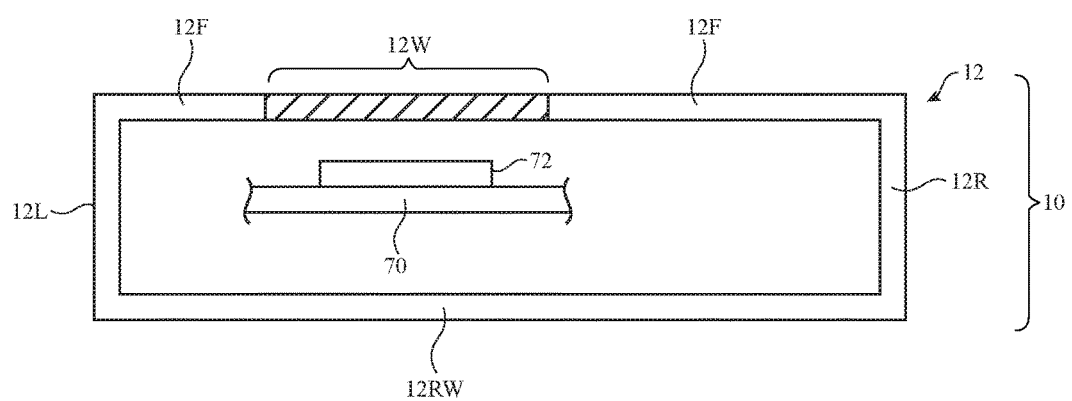
FIG. 10 is side view of an illustrative item having a fabric housing with a window in accordance with an embodiment.

In the example of FIG. 10, item 10 is an electronic device with a housing formed from fabric 12 (or formed from fabric 12 and other materials such as plastic members, metal members, glass structures, ceramic housing portions, etc.). Circuitry (see, e.g., circuitry 16 of FIG. 1) such as electrical components 72 may be mounted on one or more substrates such as printed circuit 70 in the interior of the housing formed from fabric 12. The strands used in forming fabric 12 may have different properties at different locations along their lengths.

As described in connection with FIG. 6, fabric 12 may have different properties in different areas due to the varying properties of strands 20 along their lengths. For example, fabric 12 of FIG. 10 may have different properties in region 12W than in rear wall region 12RW, sidewall regions 12L and 12R along the peripheral edges of device 10, and front face region 12F. In regions 12L, 12R, 12RW, and 12FW, for example, the portions of strands 10 that are present may contain metal particles and may therefore be conductive and not be radio-transparent. In region 12W, the metal particles may be removed or may be reduced in quantity, so that strands 20 in this region are less conductive (e.g., insulating) and do not block radio-frequency wireless signals. In this way, region 12W may form a radio-transparent window that allows components such as component 72 to transmit and receive wireless signals through region 12W. Component 72 may include an antenna and other wireless communications circuitry that handles cellular telephone transmissions, wireless local area network transmissions, or other wireless communications.

As another example, region 12W may be optically transparent at one or more wavelengths of interest, component 72 may be a light-based component such as a light-emitting diode or other light source for a status indicator light or other visible output devices, a light source and light detector that form an optical proximity sensor operating at infrared wavelengths or other suitable wavelengths, a flash for a camera, a camera or other digital image sensor device, a ambient light sensor, etc. Portions of fabric 12 may be clear, portions of fabric 12 may be opaque, and/or portions of fabric 12 may be translucent. Different areas may be colored differently and/or may have other distinct properties.

If desired, equipment may vary the density with which strands 20 are woven, knitted, or braided in different areas of fabric 12 or may otherwise locally change fabric 12 in different areas of fabric 12. These techniques for altering the construction of fabric 12 in different areas may be used in conjunction with using strands that vary along their lengths to vary the properties of fabric 12 in different areas.

If desired, patterns in fabric 12 such as the pattern of region 12W or other patterned areas of fabric 12 associated with distinct strand properties may be used in forming text, icons, key labels (e.g., alphanumeric characters or other key symbols, which may sometimes be referred to as glyphs), decorative trim, sensor electrodes (e.g., for a capacitive proximity sensor), and/or other patterns. These patterns may overlap fabric keys, portions of a removable case or other item in which an electronic device such as a cellular telephone, tablet computer, or other electronic device may be placed, portions of a wristwatch strap, etc. As an example, black portions of strands 20 (e.g., portions formed from black polymer) may be used in forming a fabric keyboard. Selected portions of these strands may be white (e.g., white polymer) and may be used in forming keyboard symbols (glyphs) for the keys in the keyboard.

Different areas of fabric 12 such as area 12W and the other areas of FIG. 10 may be provided with different stretch properties (e.g., by varying the relative concentration of elastomeric polymer relative to rigid polymer along the length of strands 20), may be provided with different porosities (e.g., more porous fabric may be formed from thinner and therefore less dense portions of strands 20), may be provided with different levels of coarseness (e.g., fabric 12 may be smooth except in region 12W where fabric 12 is rough in texture), may be formed from strands with different optical properties (e.g., region 12W may contain strand portions with particles or chemicals that are photoluminescent or electroluminescent whereas the other regions of fabric 12 may be free of these particles or chemicals), etc.

Figure 11:
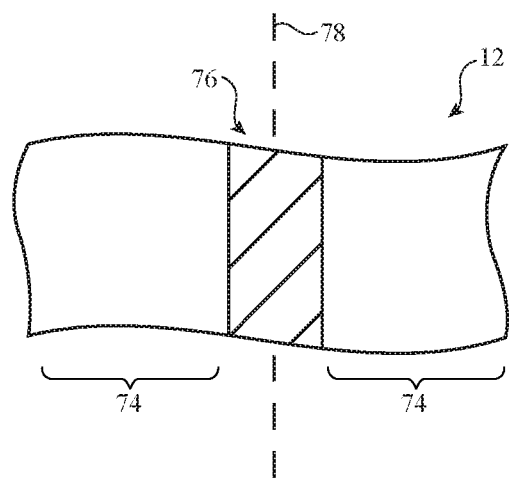
FIG. 11 is a diagram of illustrative fabric with a portion having a lowered melting temperature in accordance with an embodiment.

In the example of FIG. 11, the different properties of strands 20 at different locations along their lengths have been configured to reduce the melting temperature of fabric 12 in a particular location. For example, the melting point of fabric 12 may be lower in region 76 than in regions 74. This may facilitate laser cutting of fabric 12 along line 78 in region 76 and/or may allow region 76 to be partly melted (e.g., to coalesce strands 20 in region 78) prior to laser or mechanical cutting in region 76.

Figure 12:
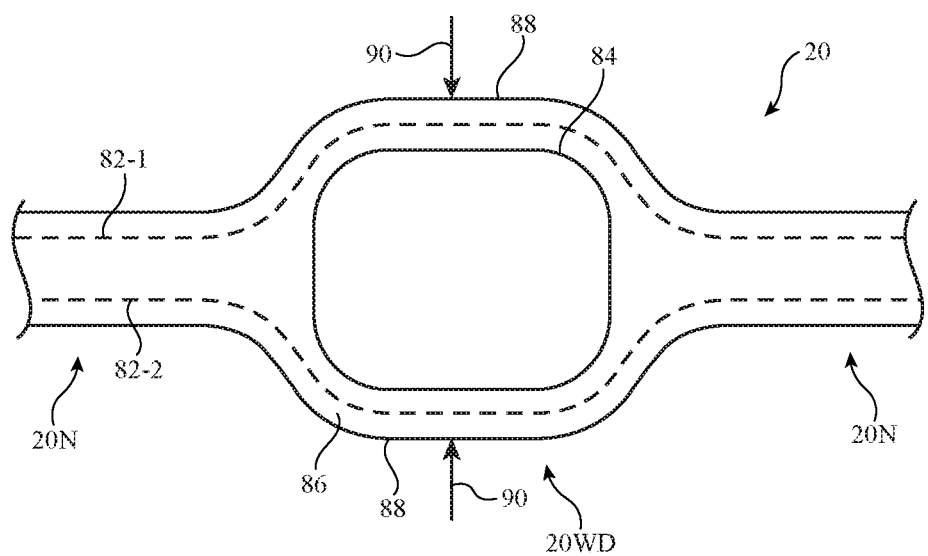
FIG. 12 is a side view of an illustrative strand of tubing configured to form a sensor in accordance with an embodiment.

FIG. 12 is a cross-sectional side view of an illustrative sensor that may be formed using extrusion equipment 42 of FIG. 5. As shown in FIG. 12, strand 20 may have different diameters at different locations along its length. For example, strand 20 may have a smaller diameter in regions 20N than in region 20WD. A bubble such as gas bubble 84 may be incorporated into strand 20 by introducing a gas into strand 20 from a gas source among sources 46. Strands of wire (e.g., bare or insulated metal wire such as copper wire) may be included in the core of strand 20, as illustrated by wires 82-1 and 82-2. These wires may be delivered into the interior of strands 20 during strand formation from respective sources 46 (FIG. 5).

Dielectric material such as polymer 86 may be used in forming strand 20 of FIG. 12. Polymer 86, which may be delivered from one of sources 46 may surround and separate wires 82-1 and 82-2 so that wires 82-1 and 82-2 do not direct contact each other and are not shorted to each other (e.g., at direct-current frequencies, wires 82-1 and 82-2 may be electrically isolated from each other). The capacitance between wires 82-1 and 82-2 may be measured using capacitance measurement circuitry in circuitry 16 that is coupled to wires 82-1 and 82-2. When an external force (e.g., a squeezing force) is applied to opposing surfaces 88 of strand 20 in directions 90, the portions of wires 82-1 and 82-2 in region 20WD may be brought into close proximity to each other. This alters the capacitance between wires 82-1 and 82-2. The capacitance measurement circuitry that is coupled to the wires can detect this change, so that control circuitry in item 10 can take appropriate action. For example, portion 20WD of strand 20 may serve as a switch that a user of item 10 can use to change a media track during media playback operations, may serve as a switch to change a playback volume, may serve as an on-off switch, or may serve as any other suitable input device for item 10.

If desired, custom clothes and other fabric-based items may be formed from strands 20. For example, a user's body (e.g., a user's hands, feet, etc.) can be scanned using a three-dimensional scanning system and a computer-aided design system can construct custom clothing designs based on the measured shape of the user's body parts. Custom strands 20 and custom fabric 12 formed form the custom strands can then be created based on a custom design from the computer-aided design system. For example, based on a design that locates more dense areas of fabric 12 formed from tighter weaving and/or strands 20 of locally enhanced diameter over portions of the body where dense fabric is appropriate (e.g., where perspiration is less concentrated) and locating less dense areas formed from looser weaving and/or strands 20 of locally decreased diameter over portions of the body where less dense fabric is appropriate (e.g., where perspiration is more concentrated).

The foregoing is merely illustrative and various modifications can be made to the described embodiments. The foregoing embodiments may be implemented individually or in any combination.

What is claimed is:

1. A fabric-based item comprising:
a layer of fabric formed from extruded strands of material, wherein the layer of fabric has first and second areas, wherein the first area is formed from first portions of the extruded strands, wherein the second area is formed from second portions of the extruded strands, wherein the strands are characterized by a property that has a first value in the first portions and a second value in the second portions.

2. The fabric-based item defined in claim 1 wherein the layer of fabric is configured to form an electronic device housing, wherein the fabric-based item further comprises wireless circuitry in the electronic device housing, wherein the first area overlaps the wireless circuitry, wherein the property comprises radio-frequency signal transparency, and wherein the first area is more radio-frequency transparent than the second area and serves as a radio-transparent window for the electronic device housing through which the wireless circuitry transmits and receives wireless signals.

3. The fabric-based item defined in claim 1 wherein the property comprises strand diameter and wherein the first value is a first diameter and the second value is a second diameter that is larger than the first diameter.

4. The fabric-based item defined in claim 1 wherein the property comprises conductivity and wherein the first value is a first conductivity and the second value is a second conductivity that is larger than the first conductivity.

5. The fabric-based item defined in claim 1 wherein the property comprises optical transparency and wherein the first value is a first optical transparency and wherein the second value is a second optical transparency that is greater than the first optical transparency.

6. The fabric-based item defined in claim 1 wherein the strands are extruded polymer strands, wherein the property comprises particle concentration in the extruded polymer strands, wherein the first value is a first particle concentration, and wherein the second value is a second particle concentration that is different than the first particle concentration.

7. The fabric-based item defined in claim 1 wherein the property comprises color, wherein the first value is a first color, wherein the second value is a second color that is different than the first color, and wherein the first area is configured to form a key label symbol.

8. The fabric-based item defined in claim 1 wherein the property comprises strand stiffness and wherein the first value is a first stiffness and wherein the second value is a second stiffness that is greater than the first stiffness.

9. The fabric-based item defined in claim 1 wherein the strands include markers.

10. The fabric-based item defined in claim 9 wherein the markers are each multi-element markers.

11. The fabric-based item defined in claim 9 wherein the markers include magnetic particles in the strands.

12. The fabric-based item defined in claim 9 wherein the markers include circumferential bands around the strands and wherein the markers are located at positions along the strands at which the first portions transition to the second portions.

13. A fabric, comprising:
a layer of intertwined extruded strands of material having first and second areas, wherein the first area is formed from first portions of the extruded strands, wherein the second area is formed from second portions of the extruded strands, wherein the first portions are formed from polymer that includes particles with a given concentration, and wherein the second portions are formed from the polymer with less than the given concentration of particles.

14. The fabric defined in claim 13 wherein the intertwined extruded strands of material comprise woven warp and weft strands and wherein the particles comprise metal particles.

15. The fabric defined in claim 13 wherein the particles comprise magnetic particles.

16. The fabric defined in claim 13 wherein the first area is characterized by a first optical transparency and wherein the second area is characterized by a second optical transparency that is greater than the first optical transparency.

17. Apparatus, comprising:
fabric having strands of material with properties that vary along their lengths; and
a marker on each strand of material, wherein the marker comprises a marker selected from the group consisting of: a magnetic marker, a conductive marker, and an optical marker.

18. The apparatus defined in claim 17, wherein the fabric has a first area formed from first portions of the strands and a second area with different properties than the first area formed from second portions of the strands and wherein the marker on each strand is located between the first and second portions of that strand.

19. The apparatus defined in claim 18 wherein the strands comprise extruded polymer and wherein the markers are formed from particles in the polymer.

20. The apparatus defined in claim 18 wherein the strands comprise extruded polymer and wherein the markers comprise optical markers on the polymer.

* * * * *